United States Patent
Koppens et al.

(10) Patent No.: US 8,507,890 B1
(45) Date of Patent: Aug. 13, 2013

(54) PHOTOCONVERSION DEVICE WITH ENHANCED PHOTON ABSORPTION

(75) Inventors: Frank Koppens, Barcelona (ES); Francisco Javier García de Abajo, Madrid (ES)

(73) Assignees: Fundacio Institut de Ciencies Fotoniques (ES); Consejo Superior de Investigaciones Cientificas (ES)

( * ) Notice: Subject to any disclaimer, the term of this patent is extended or adjusted under 35 U.S.C. 154(b) by 0 days.

(21) Appl. No.: 13/358,668

(22) Filed: Jan. 26, 2012

(51) Int. Cl.
*H01L 29/06* (2006.01)

(52) U.S. Cl.
USPC ............... 257/9; 257/10; 438/20; 977/734; 977/742; 977/755

(58) Field of Classification Search
USPC ............. 257/9–10; 438/20; 977/734, 742, 977/755
See application file for complete search history.

(56) References Cited

U.S. PATENT DOCUMENTS

| | | | |
|---|---|---|---|
| 2010/0025662 A1* | 2/2010 | Cho et al. | 257/40 |
| 2011/0024792 A1* | 2/2011 | Biris et al. | 257/184 |
| 2012/0186648 A1* | 7/2012 | Zang et al. | 136/256 |

OTHER PUBLICATIONS

Kim et al. (Journal of Physical Chemistry C2012, 116, 1535-1543).*
Yury P. Bliokh, "Total Absorption of an Electromagnetic Wave by an Overdense Plasma", Physical Review Letters, PRL 95, 165003 (2005), week ending Oct. 14, 2005.
N. I. Landy, "Perfect Metamaterial Absorber" Physical Review Letters, PRL 100, 207402 (2008), week ending May 23, 2008.
Sukosin Thongrattanasiri, "Complete Optical Absorption in Periodically Patterned Graphene" Physical Review Letters, PRL 108, 047401 (2012), week ending January 27, 2012.

* cited by examiner

Primary Examiner — Jami M Valentine
(74) Attorney, Agent, or Firm — Cantor Colburn LLP

(57) ABSTRACT

An infrared photoconversion device comprising a collector with at least an active layer made of a single sheet of doped single-layer, bilayer, or multilayer graphene patterned as nanodisks or nanoribbons. The single sheet of doped graphene presents high absorbance and thus, the efficiency of devices such as photovoltaic cells, photodetectors, and light emission devices can be improved by using graphene as the central absorbing or emitting element. These devices become tunable because their peak absorption or emission wavelength is changed via electrostatic doping of the graphene.

20 Claims, 12 Drawing Sheets

PHOTOCONVERSION DEVICE WITH ENHANCED PHOTON ABSORPTION

TECHNICAL FIELD

The present invention relates to photoconversion devices such as photovoltaic cells, photodetectors and light sources.

BACKGROUND OF INVENTION

Light absorption plays a central role in optical detectors and photovoltaics. Inspired by nature, two different routes have been investigated to achieve perfect absorption. A first one consists in relying on diffusion in disordered lossy surfaces (e.g., black silver and carbon). Engineered materials have been synthesized following this solution to produce extraordinary broadband light absorption (e.g., dense arrays of carbon nanotubes). A second approach consists in using ordered periodic structures, as found in some nocturnal insects, where they produce the moth eye effect. This alternative has been pioneered by experimental and theoretical work showing total light absorption (TLA) in the visible using metallic gratings. In this context, the Salisbury screen (U.S. Pat. No. 2,599,944 B1), consisting of a thin absorbing layer placed above a reflecting surface, has been known to produce TLA, and it can be integrated in thin structures using magnetic-mirror metamaterials. Similar phenomena have been reported at infrared (IR) and microwave (Y. P. Bliokh, J. Felsteiner, and Y. Z. Slutsker, Phys. Rev. Lett. 95, 165003, 2005; N. I. Landy, S. Sajuyigbe, J. J. Mock, D. R. Smith, and W. J. Padilla, Phys. Rev. Lett. 100, 207402, 2008) frequencies, including omnidirectional TLA, which has been realized by using periodic surfaces supporting localized plasmon excitations. However, due to the specific material properties, none of these technologies have enabled conversion from absorbed light into electrical signals, or have been very inefficient as such. Additionally, these devices did not exhibit in-situ tunability of the absorption spectrum, neither emission frequencies in the infrared or THz range.

SUMMARY OF THE INVENTION

The present invention relates to photoconversion devices such as photovoltaic cells, photodetectors and light sources. In particular, the invention provides devices in which higher light absorption, or more efficient light emission can take place thanks to a single or multi-layer sheet of patterned and doped graphene. In addition, the devices of the invention also provide optimum thermal emission occurring at specific wavelengths that are selected by means of applied electric fields. And finally, it provides devices that utilize the infrared part of the solar spectrum to optimize conversion into electrical signals for improved solar cells.

In particular, the present invention solves the problems of the prior art previously commented by using graphene plasmons in an absorbing active layer of a photoconversion device.

The general working principle of the graphene plasmons in the device is as follows: graphene plasmons are collective excitations of valence electrons in graphene, a one-atom-thick layer of carbon. When the graphene is structured, the frequency of these plasmons can be customized to the desired range from the infrared to the THz and beyond. Graphene plasmons occur only if the graphene is doped with an excess of electrons or holes, otherwise these plasmons cease to exist (although there exists another set of plasmons at higher energy in the visible and ultraviolet that are less sensitive to external control, that are not further considered in this document, and that are spectrally separated from the ones we are concerned with here, which emerge in the infrared to THz and beyond). Besides, the frequency of these low-energy plasmons can be directly controlled by adjusting the density of charge carriers produced by the noted doping. In practice, doping of graphene has been performed via electrostatic gating, that is, by placing electrodes close or in contact to the graphene, so that the carbon layer has to redistribute its charges in order to screen the resulting electrostatic potentials. This means that the plasmons in this material have frequencies that can be changed at will by playing with the potential applied to the mentioned electrodes.

Using the ability of controlling the optical response of graphene, as well as the frequency and even the mere existence of its trapped optical modes, three different sets of devices are provided, for light detection (spectral photodetectors), for light emission (tunable sources), and for conversion of light into electricity (solar cells). The underlying principle of operation in all three devices is the strong coupling of light with plasmons in graphene (collective oscillations of conduction electrons). The frequency of these plasmons depends on the level of charging (i.e., doping), which is varied as specified above.

For spectral photodetectors, the present invention provides devices comprising patterned graphene that can absorb up to 100% of light at specified light wavelengths. These light wavelengths coincide with those needed to excite the plasmons (but notice that the plasmon wavelengths are reduced by a large factor with respect to the light wavelengths), because the absorption mechanism is mediated by the plasmons. Light is thus preferentially absorbed at the resonant light wavelength (i.e., the one needed to excite a plasmon), and therefore, the amount of absorbed light energy depends on the light intensity at that wavelength incident on the device. This energy is converted into heat, which produces a thermoelectric effect. The thermoelectric signal is then read, and its intensity reveals the intensity of light at the selected incident wavelength. This wavelength is then scanned over the desired range by electrostatic tuning (see above), which allows us to construct a spectrum. We thus have a spectral photodetector capable of resolving spectra of the incident light. The detector has a size of only a few microns.

For light sources, we use a similar device in which heating is produced by a heating element inside it. The graphene temperature is raised by several hundred degrees above room temperature, which causes thermal emission. The emission at a certain wavelength is proportional to the absorption at the same wavelength because of the detailed balance principle, which in this case is called Kirchhoff's law. Thus, light is preferentially emitted at the plasmon wavelength, which is tuned electrostatically. This results in a device capable of emitted light with a dominant wavelength component that can be tuned over a certain spectral range.

These principles for photodetectors and sources are general and can be applied to a wide range of spectral domains, from the infrared to the THz and beyond. However, graphene is ideally suited to cover the infrared and THz regions.

For light-to-electricity conversion, we rely on plasmons as well. Light is absorbed at the graphene to excite plasmons. Plasmons decay into electrons and holes. Junctions between the graphene and p/n semiconductors mediate the separation of electrons and holes in a way similar to what is done in conventional photovoltaic solar cells. Graphene can take care of converting the infrared part of the spectrum, for which conventional semiconductor technology is not very efficient. A battery of graphene convertors is provided, so that each convertor is specialized in a narrow spectral domain. Light is previously separated by a grating or prism, so that its convertor receives light of a wavelength at which it is most efficient.

BRIEF DESCRIPTION OF THE FIGURES

To complete the description and in order to provide for a better understanding of the invention, a set of drawings is provided.

DETAILED DESCRIPTION OF THE INVENTION

Figure 1A:
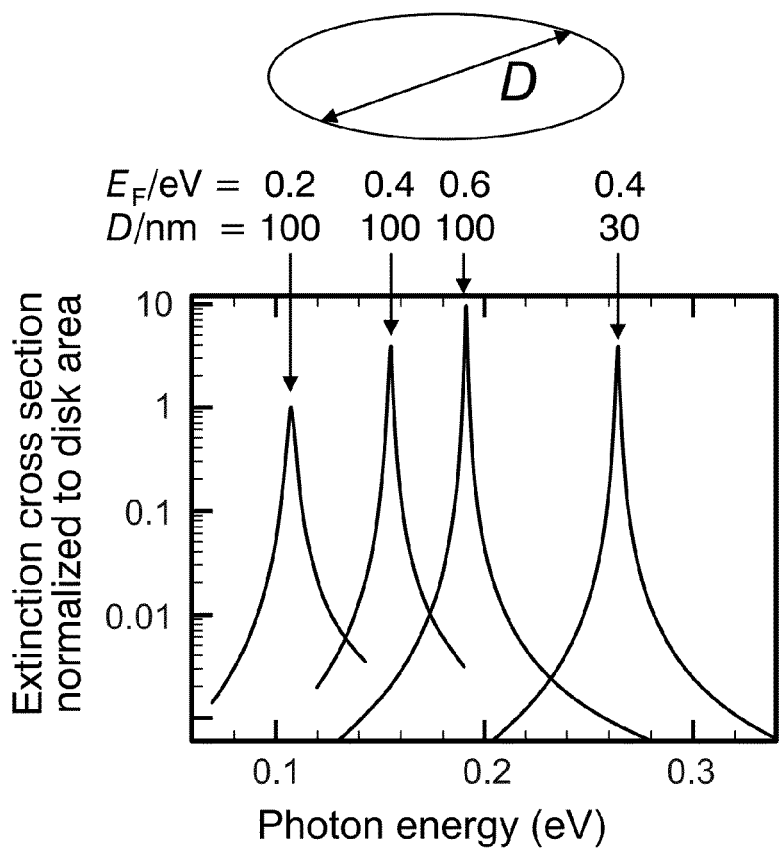
FIG. 1A shows calculated extinction cross-sections for graphene nanodisks.
Figure 1B:
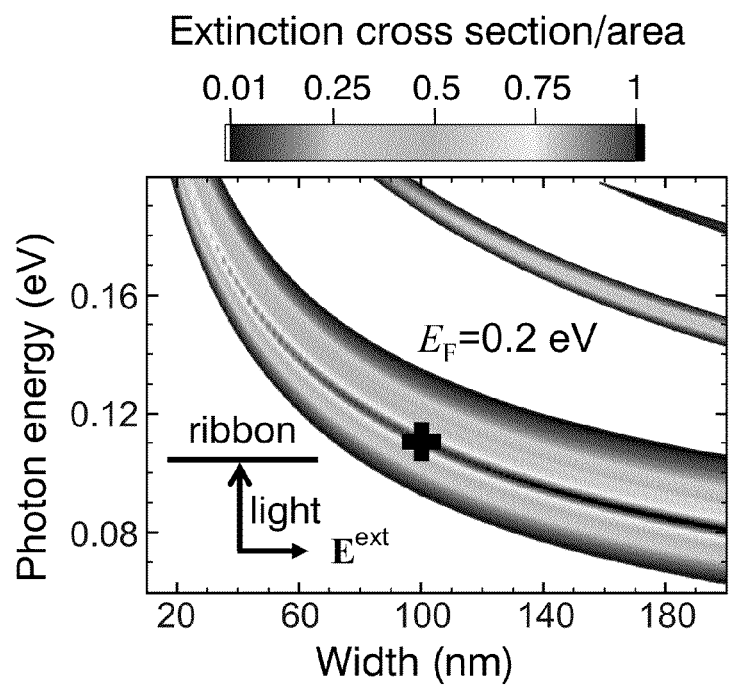
FIG. 1B shows calculated extinction cross-sections for graphene nanoribbons.

The individual graphene structures of the present invention are able to absorb light very efficiently. We show in FIG. 1 calculated results for the cross section of nanodisks and nanoribbons. These calculations, and the ones discussed below, are performed by solving Maxwell's equations using a realistic description of the graphene using the local random-phase approximation [F. H. L. Koppens, D. E. Chang, and F. J. García de Abajo, Graphene Plasmonics: A Platform for Strong Light-Matter interactions, Nano Letters 11, 3370-3377 (2011)]. For disks (FIG. 1A), the diameter and Fermi energy (i.e., the level of doping) is indicated for each absorption spectrum. For ribbons (FIG. 1B), we represent the absorption cross section as a function of ribbon width for fixed Fermi energy (0.2 eV). The absorption cross section is defined as the effective area on which impinging light is absorbed. The plots here show a large increase in the absorption cross-section at specific light wavelengths corresponding to those capable of exciting the plasmons in nanodisks (FIG. 1A) and nanoribbons (FIG. 1B). The absorption cross section reaches values exceeding the geometrical cross section of the graphene structures. The significance of such large cross section is twofold: first, it allows us to absorb much more energy per unit of graphene area than a homogeneous graphene sheet; and furthermore, it allows us to absorb as much as 100% (see below) with a suitable distribution of nanodisks or nanoribbons. Obviously, these results are not restricted to nanodisks or nanoribbons, but they can be achieved with other patterns, for example, triangles, hexagons, etc. In particular, triangles and hexagons can be advantageous because they allow selecting uniform crystallographic directions of the graphene edges, thus minimizing undesired losses due to edge effects in structures of small size below a few tens of nanometers.

Figure 2A:
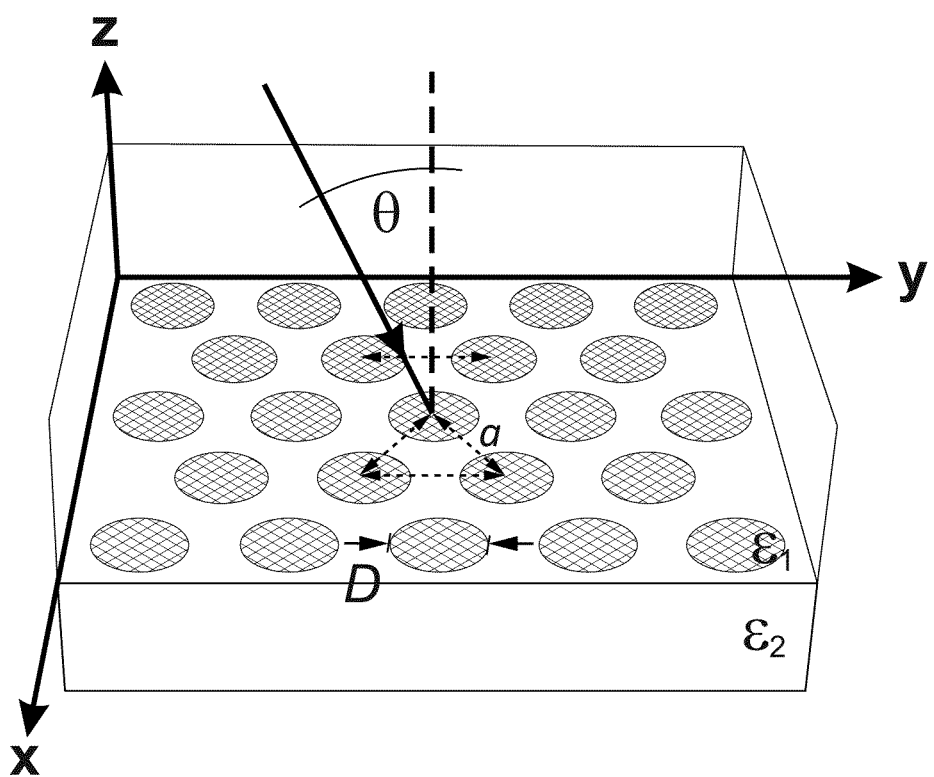
FIG. 2A shows a scheme of a periodic array of graphene disks placed at the interface between two different dielectrics.
Figure 2B:
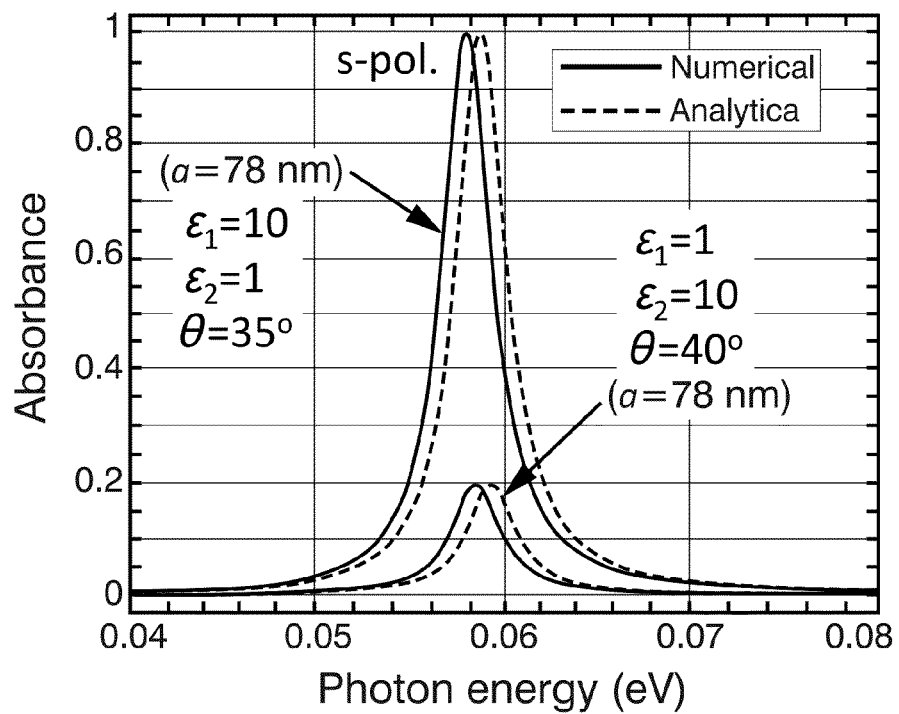
FIGS. 2B and 2C show absorption spectra calculated for arrays of graphene disks and different parameters of the angle of incidence, incident light polarization, and dielectric constants of the two media surrounding the graphene.
Figure 2C:
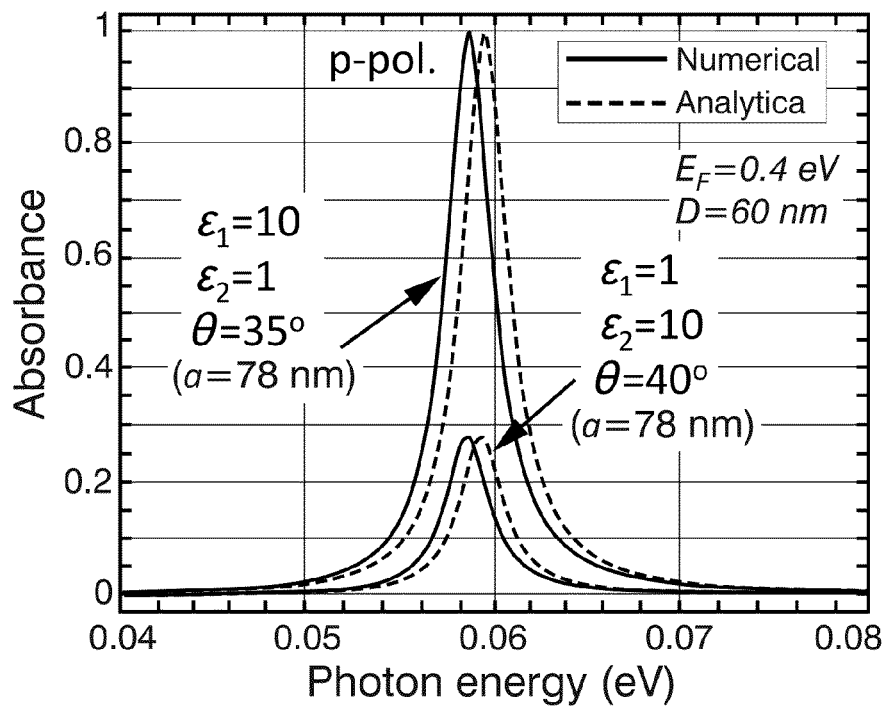
Figure 2D:
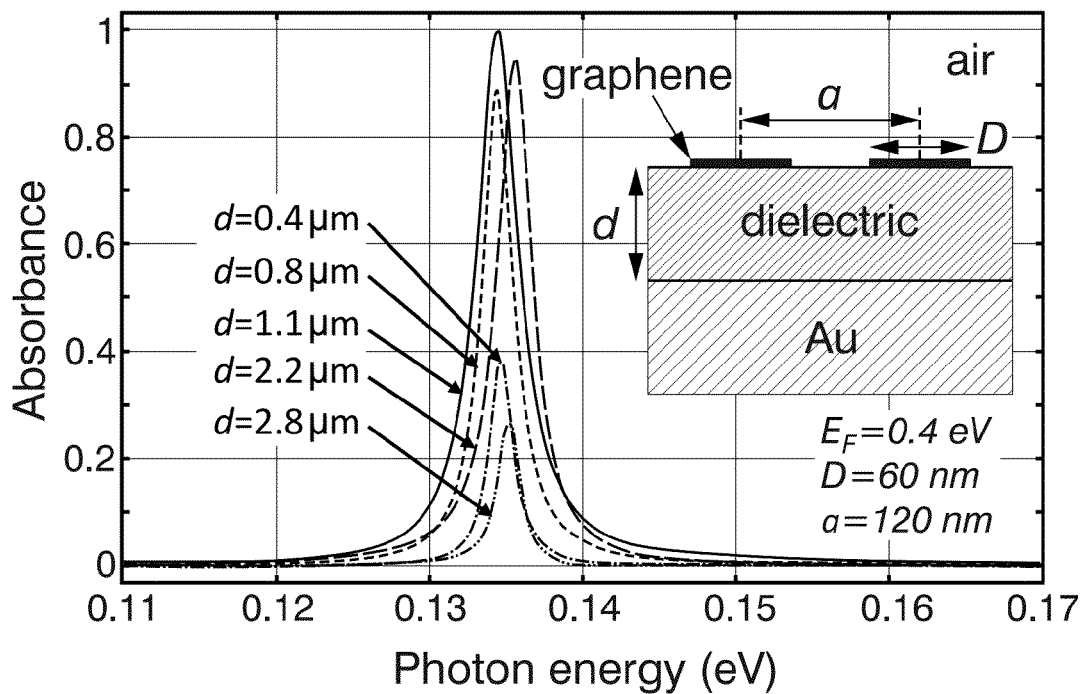
FIGS. 2D and 2E show calculated absorption spectra for periodic arrays of graphene sitting on a dielectric layer on top of a gold substrate.
Figure 2E:
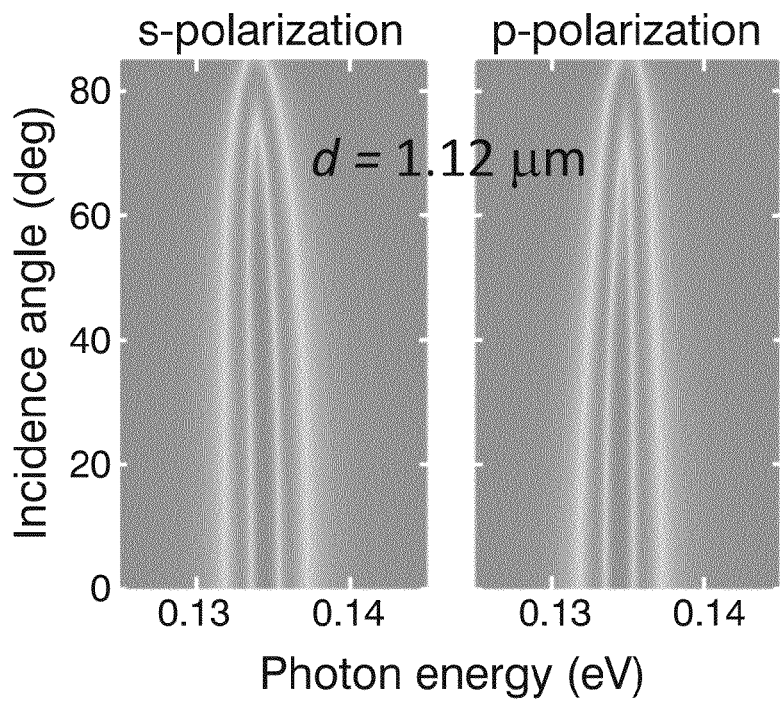

In a graphene layer, the absorption can be maximized when the absorption cross-section of the individual components of the structure exceeds their geometrical cross section [S. Thongrattanasiri, F. H. L. Koppens, and F. J. García de Abajo, Complete Optical Absorption in Periodically Patterned Graphene, Physical Review Letters (in press)]. These are the conditions shown above for graphene nanodisks and nanoribbons. We show in FIG. 2 that this leads to 100% absorption in the case of nanodisks. Similar calculations for nanoribbons show 100% absorption as well under similar conditions. FIG. 2A shows a scheme of a periodic array of graphene disks sitting at the interface between two different dielectrics. Similarly, complete optical absorption is also obtained for an array of graphene ribbons (not shown). FIGS. 2B and 2C show absorption spectra calculated for arrays of graphene disks and different parameters of the angle of incidence, incident light polarization, and dielectric constants of the two media surrounding the graphene. The light is coming from medium labelled with medium 1 in FIG. 2A. Under total internal reflection conditions, we find 100% absorption of the light at a photon energy of 60 meV. This energy can be tuned by changing the Fermi energy or the geometrical parameters. Similar results are observed for peaks of absorption within the infrared part of the spectrum. In FIGS. 2D and 2E, we show absorption spectra for periodic arrays of graphene sitting on a dielectric layer on top of a gold substrate. The absorption is again 100% when the patterned graphene is periodically arranged. Again, the photon energy at which this maximum occurs can be tuned by changing the Fermi energy or the geometrical parameters. FIG. 2E shows that this effect occurs for a broad range of angles, and thus, the complete optical absorption effect is omnidirectional. These results are the basis of the devices provided in this document and discussed below. Similar results are obtained for arrays of graphene ribbons or other periodic patterns of graphene. Non-periodic structures can also produce large absorption, but not 100% in general, at peak wavelengths depending on the local geometry. It is important to bear in mind that 100% absorption requires either total internal reflection (FIGS. 2B and 2C) or a so-called Salisbury screen (FIG. 2D), as well as a suitable choice of geometrical parameters. The exact conditions under which the effect occurs are well established from simulations: (i) one starts with disks or ribbons showing an absorption cross-section exceeding their areas when they are considered individually (this condition is given for specific combinations of sizes and doping levels, an example of which is shown in FIG. 1, but more results are easily obtained from an exhaustive search of parameters based upon the simulations described above, in order to guide actual implementations); (ii) then one constructs arrays (e.g., square or hexagonal arrays of disks, or 1D gratings of aligned ribbons, in which the ribbons are separated by a certain distance; all of these arrays have the graphene in the same plane, on top of a substrate); (iii) the remaining parameter is the separation (i.e., the array lattice constant) between graphene elements (e.g., disks or ribbons), in order to obtain 100% absorption, as shown in the examples provided in FIG. 2 (a similar simulation search can be carried out for elements with the desired size and doping level). Complete absorption is always possible by exploiting these configurations, provided the graphene units of the periodic structure have a cross section exceeding the area of the unit cell [S. Thongrattanasiri, F. H. L. Koppens, and F. J. García de Abajo, Complete Optical Absorption in Periodically Patterned Graphene, Physical Review Letters (in press)]. Nonetheless, the use of graphene disks, ribbons, or other graphene patterns produces plasmons that resonate at specific light wavelengths, leading to enhanced light absorption at those wavelengths.

Figure 3A:
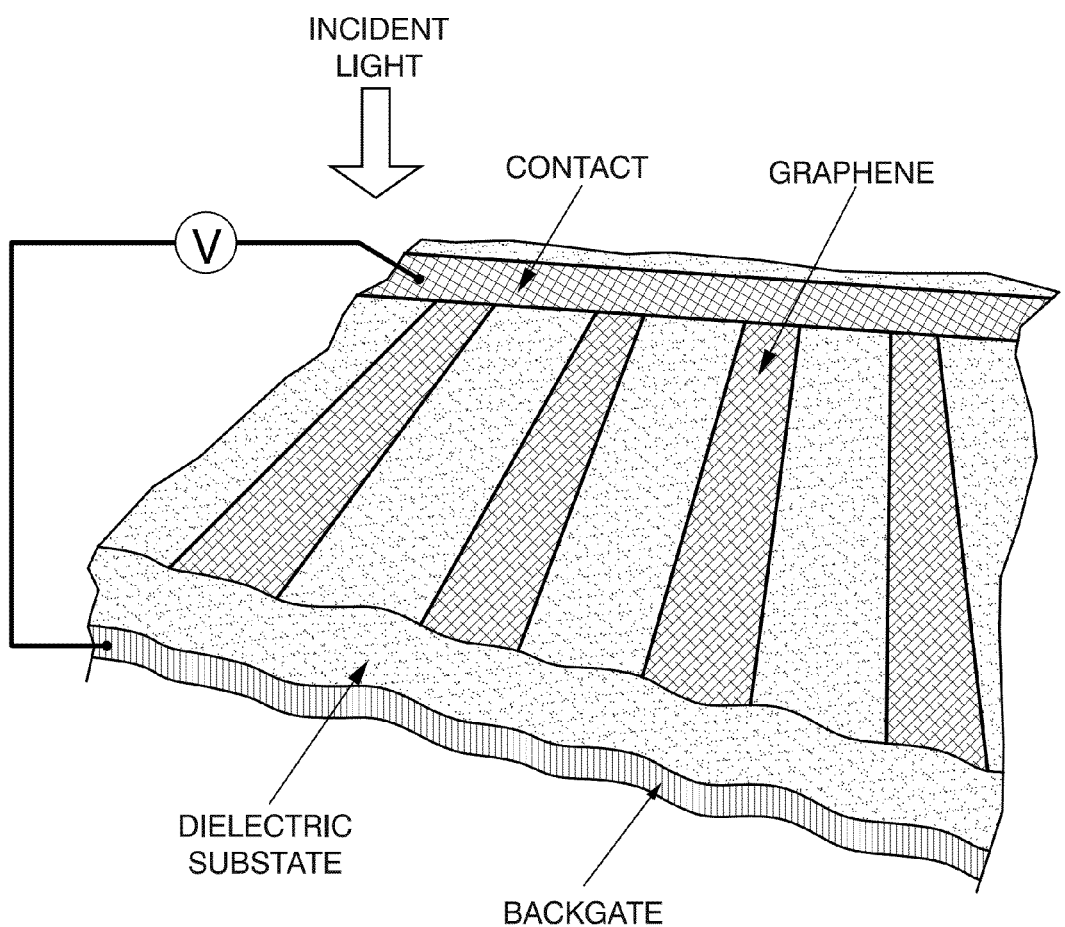
FIG. 3A shows a possible implementation of arrays of graphene nanoribbons to produce tunable absorption at the desired wavelengths via electrostatic doping.

FIG. 3A shows an example of how to dope an array of graphene nanoribbons, patterned on a dielectric substrate that includes a backgate. A contact at one end of the ribbons (this can be made of metal deposited by, for example, lithographic methods, or it can be part of the graphene, which is contacted to an external lead far away from the ribbon structure) provides a difference in potential between the graphene and a backgate layer immediately below the dielectric substrate, which is compensated by charging the ribbons. The applied voltage V controls the amount of charging or doping (i.e., the Fermi energy of the ribbons). The backgate can be made of conducting doped silicon (this is convenient if a dielectric silica layer is made by oxidation of the silicon). If made of a metal layer grown underneath the dielectric substrate, the metallic Salisbury screen as discussed above is achieved, this having the advantage that the device has a 100% efficiency.

Figure 3B:
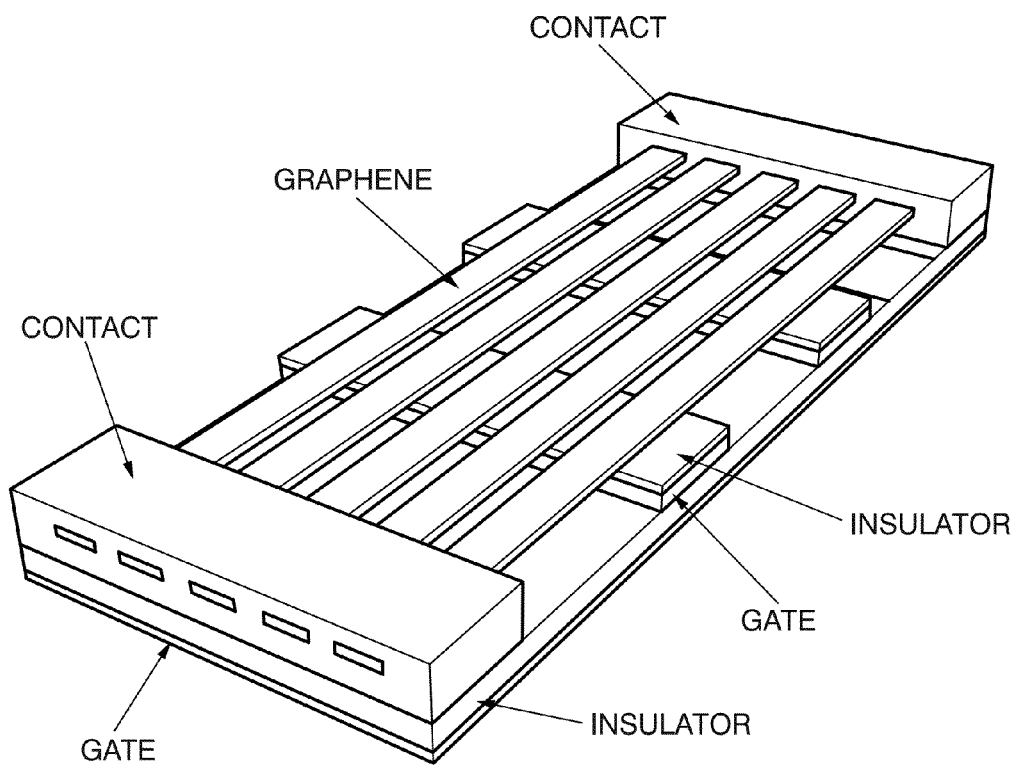
FIG. 3B shows an alternative embodiment in which graphene nanoribbons are on top of a back gate separated by an insulating layer.

FIG. 3B shows another embodiment with graphene nanoribbons on top of a gate electrode separated by an insulating layer. Additionally, local gate electrodes are deposited below the nanoribbons. By applying the appropriate voltages to the gates, pn-junctions in the ribbons can be formed (to be used in the photovoltaic devices described below). Light absorbed in the ribbons is converted into an electronic signal (current flow or voltage). Modifications to this design include the following possibilities: (i) ribbons can be replaced by other shapes (disks, holes in graphene, graphene on patterned substrate, etc.); (ii) graphene can be replaced by bilayer graphene, so that the gates can open a bandgap and pn-junctions at the same time, thus enabling this device to generate power from absorbed light (for photovoltaics discussed below); (iii) the gates can be metal, ITO, conducting polymer, graphene, nanotubes, or any other conducting material, or a combination of materials; (iv) on top of the local gates, a thin layer of oxide can be deposited, and this oxide can be $SiO_{2\,2}$, $MgO_2$, $HfO_2$, $TiO_2$, or any other insulating material. Multilayer graphene can also be employed, rather than monolayer or bilayer graphene.

Figure 3C:
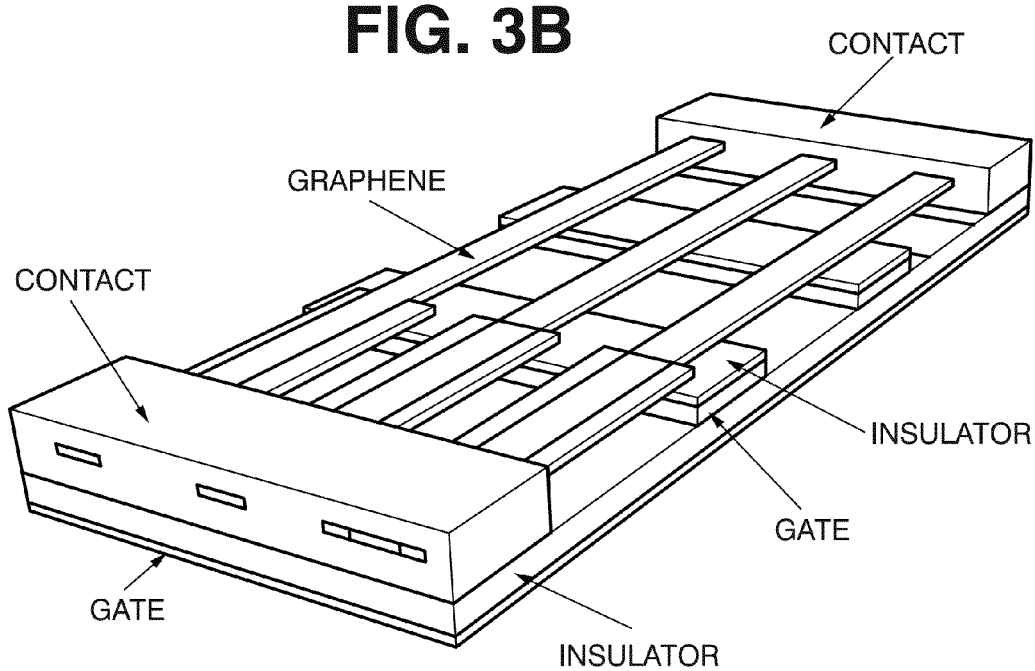
FIG. 3C shows another embodiment in which the graphene pattern is non-uniform along the device.

FIG. 3C shows yet another embodiment, in which the graphene pattern can be non-uniform along the device in order to realize light absorption only locally (for example close to the pn-junction).

Figure 3D:
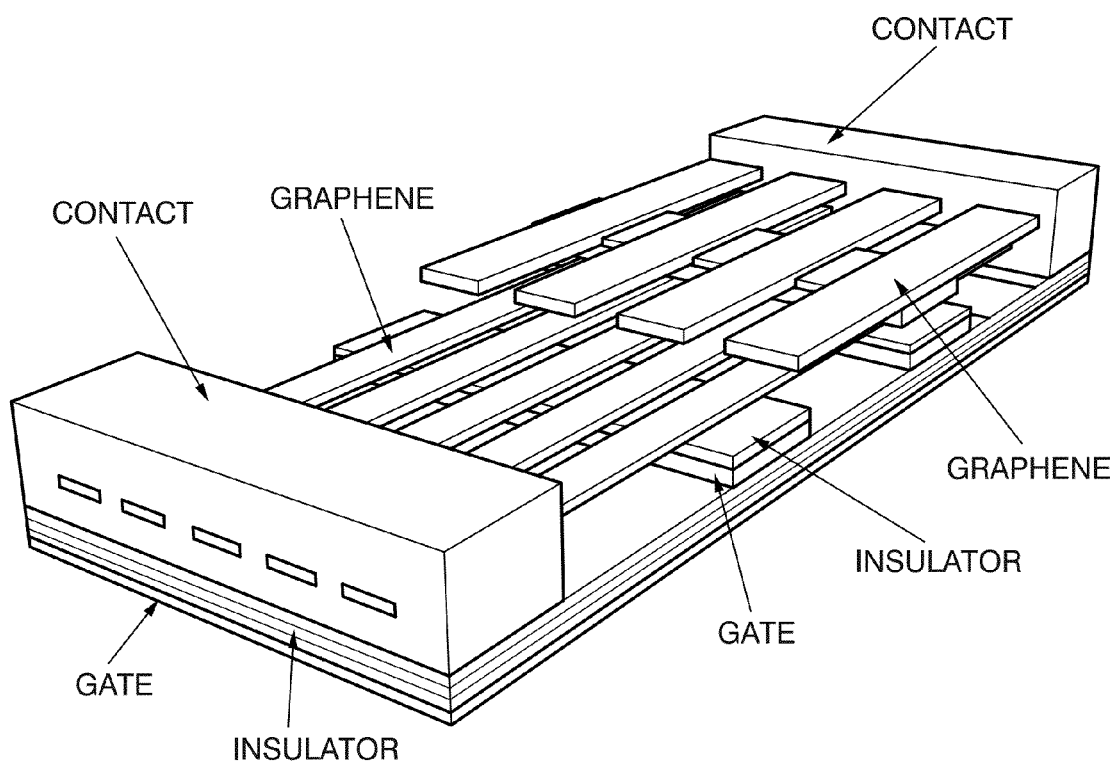
FIG. 3D shows another embodiment in which multiple layers of graphene patterns are stacked and on-uniform in the vertical direction the device.

FIG. 3D shows yet another embodiment, in which different graphene patterns are stacked on top of each other. Extra gates in between the layer provide independent tunability of the doping in the graphene.

Figure 3E:
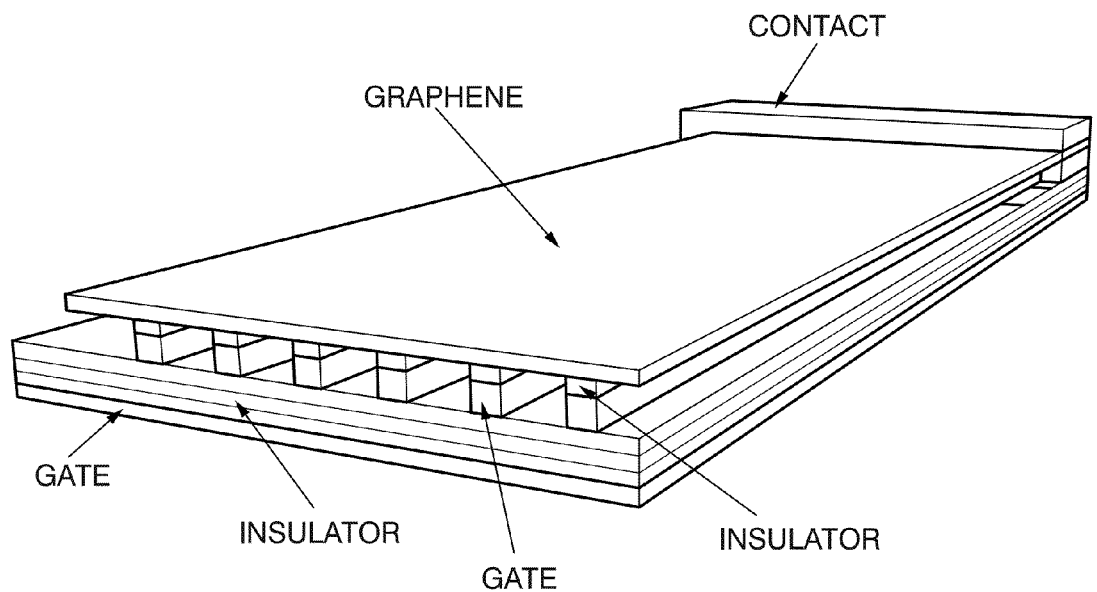
FIG. 3E shows yet another embodiment in which the graphene shows a patterned structure as a result of a patterned local gate on top.

FIG. 3E shows yet another variation, in which instead of patterning the graphene, the substrate (with graphene on top) or local gates can be patterned. The operation of the device is then based on the dielectric contrast defined by the substrate, or by the electrostatic potential profile, defined by the substrate or gates. The substrate or metallic gate modifies locally the plasmonic properties of the material. By patterning the substrate or gates, the graphene plasmonic properties can be patterned as well. This leads to effectively the same plasmonic properties as patterned graphene.

Figure 3F:
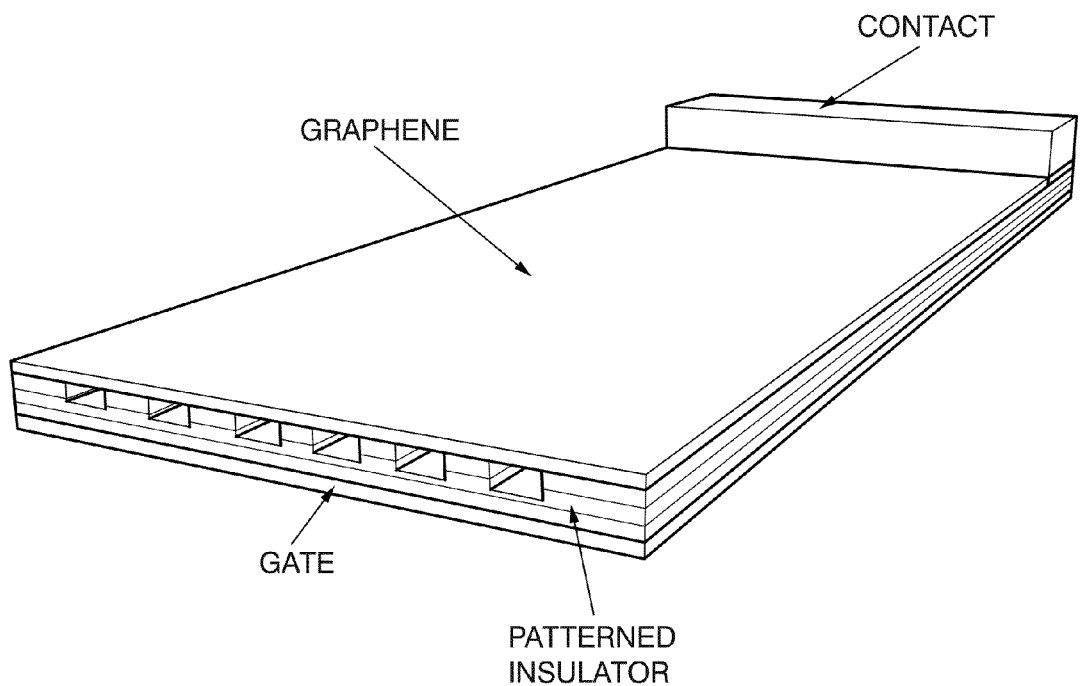
FIG. 3F shows a similar embodiment as in 3D with a patterned substrate.

Specifically, FIG. 3E shows metallic gates, patterned in ribbons, with graphene deposited on top, and a thin insulating layer separating electrically the local gates from the graphene. Additionally, FIG. 3F shows a patterned substrate (e.g., trenches in an insulator, with graphene deposited on top). A possible variation of the graphene devices provided above consists of employing SiC as the substrate material. This produces large variations in the optical response with small variations in wavelength.

Electrostatic doping can be achieved in a variety of ways. Rather than a backgate configuration, as depicted in some of the figures, one can use a biased metallic tip placed close to the graphene. Alternatively, one can use metal leads placed near the graphene on the plane of the dielectric substrate, but without actual contact with the graphene, so that doping is induced in the carbon sheet in order to screen the fields produced by the leads. Alternatively, one can use substrate materials that induce doping in the graphene, due to chemical processes or due to polarization charges present at the surface. The electric field generated by the substrate can then induce high carrier densities in the graphene.

Yet another variation consists in using a strong microwave or radiowave signal to produce a strong electric field near the graphene structures. This is particularly suited for the graphene disks. The electric field thus produces a redistribution of charges in the graphene by direct polarization, and the regions with excess of charge can thus sustain plasmons of a frequency that depends on the density of that charge, which is in turn proportional to the intensity of the applied external microwave or radiowave signal. A similar scheme can be used for other frequencies of the applied radiation, down to a DC electric field.

Figure 4:
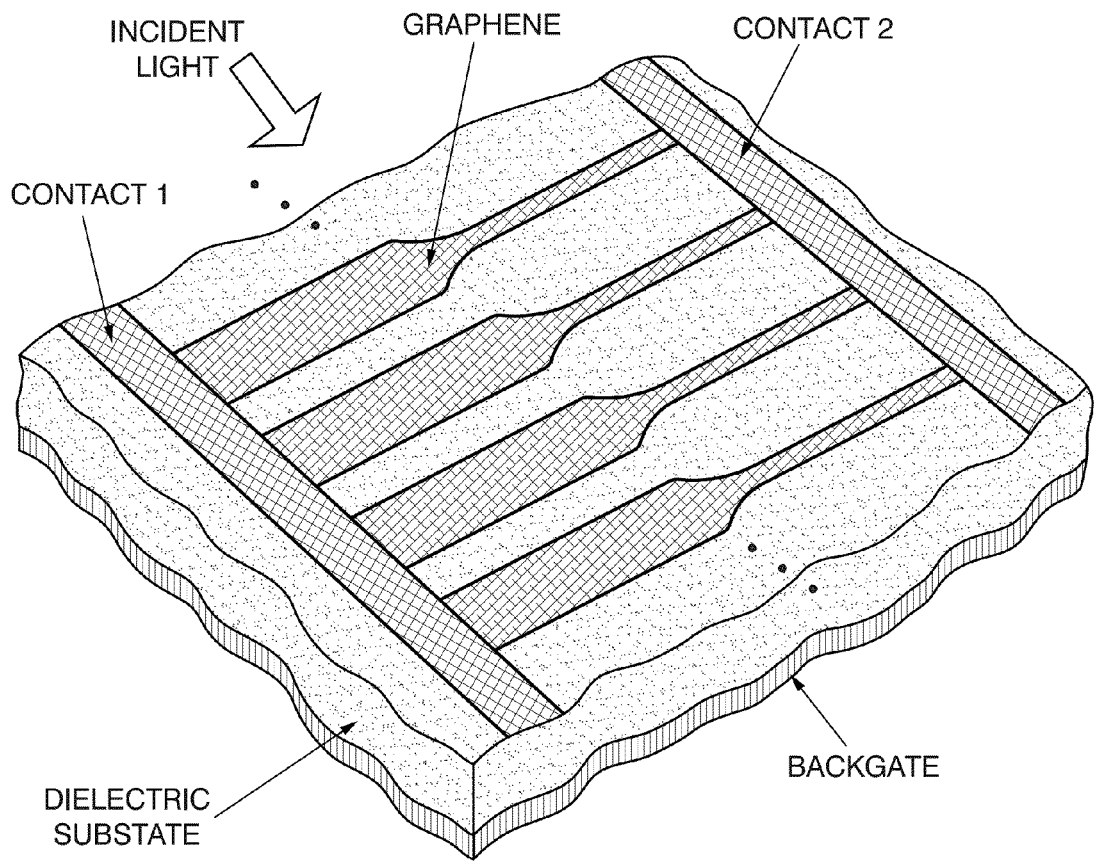
FIG. 4 shows a spectral photodetector device, in accordance with a further embodiment.

FIG. 4 shows a possible design of a spectral photodetector. It includes the same doping elements as in FIGS. 3A-3D. Besides, the graphene ribbons have two different regions: one of larger width and another one of smaller width. They are designed to resonate with the light in one of these regions (for example, the wider ribbon region). This is heated by the incident light because it is in resonance with the incidence light wavelength, whereas the thinner region is not heated the same because it is not on resonance. Two contacts are then provided, one for each region. Since the wider region and its contact are heated at a higher temperature than the narrower region and its contact, this forms a thermocouple. The voltage produced by the temperature difference in the thermocouple is thus roughly proportional to the amount of light being absorbed by the wider region (minus the amount of light absorbed in the narrower region, designed to absorb negligibly). The voltage reading, after calibration, thus provides a direct reading of the incident light intensity at the wavelength for which the resonance in the wider region graphene is placed. The two contacts can be made of either the same conductor or different conductors. It can also be made of graphene with a different doping level. In any case, the material in the contacts has to differ from the graphene in the ribbons in order to form the noted thermocouple.

Alternatively, rather than patterning the ribbons, they can be of homogeneous width and the backgate can be patterned laterally (e.g., divided into two separate backgates at different potential) or vertically (e.g., it can be at a different distance from the graphene ribbons in one region. Either of these configurations produces a doping level that is different in one of the regions of the graphene ribbons compared to the other region, so that one of the regions resonates to a given wavelength, whereas the other can be made to not resonate at all. Thus, the resulting structure has a similar functionality as the ones depicted in FIGS. 3A-3D, but instead of physically making the ribbons of varying width in each region, it is the backgate that is either placed at a difference distance from the graphene (e.g., but changing the thickness of the dielectric substrate layer) or divided into two backgates, each at a different potential.

To be more specific, a graphene structure can act as a light spectral detector as follows: light is absorbed by the graphene, but mainly light of the same frequency as the plasmon frequency will be absorbed, so a given structure will be most sensitive to a color of the light determined by the plasmon frequency; this light absorption will produce a change in local temperature in the graphene and in some of the elements near it; this will in turn induce a Seebeck (thermoelectric) effect, thus resulting in a net electrical signal; this signal is roughly proportional to the light intensity at the selected plasmon frequency; either by using an array of such graphene structures, tuned to a series of frequencies covering the desired spectral region, or by repeatedly using the same graphene structure that is electrostatically tuned to swap the desired spectral region through its plasmons, this detection procedure yields a light spectrum. Graphene plasmons are naturally situated in the infrared to THz range, thus covering a difficult spectral range, in which efficient spectral detectors are lacking.

Likewise, the graphene structure of the invention can act as an IR source as follows: the graphene is heated to a temperature T above room temperature; thermal emission will then occur within a wavelength range around b/T, where b=2.9 mm K is the Wien displacement constant (e.g., emission around 6 micron wavelength when T is 200 C); because of Kirchhoff s law, the emission will be proportional to the absorption at the same wavelength, which is in turn boosted at the plasmon frequencies; thus, a source of IR radiation is provided, peaked around the usually narrow graphene plasmons; these plasmons can be moved in frequency via electrostatic doping, thus resulting in a tunable IR source, again within a spectral range in which sources are scarce and expensive. This presents a viable, cheap alternative to other existing technologies, such as quantum cascade lasers.

Figure 5A:
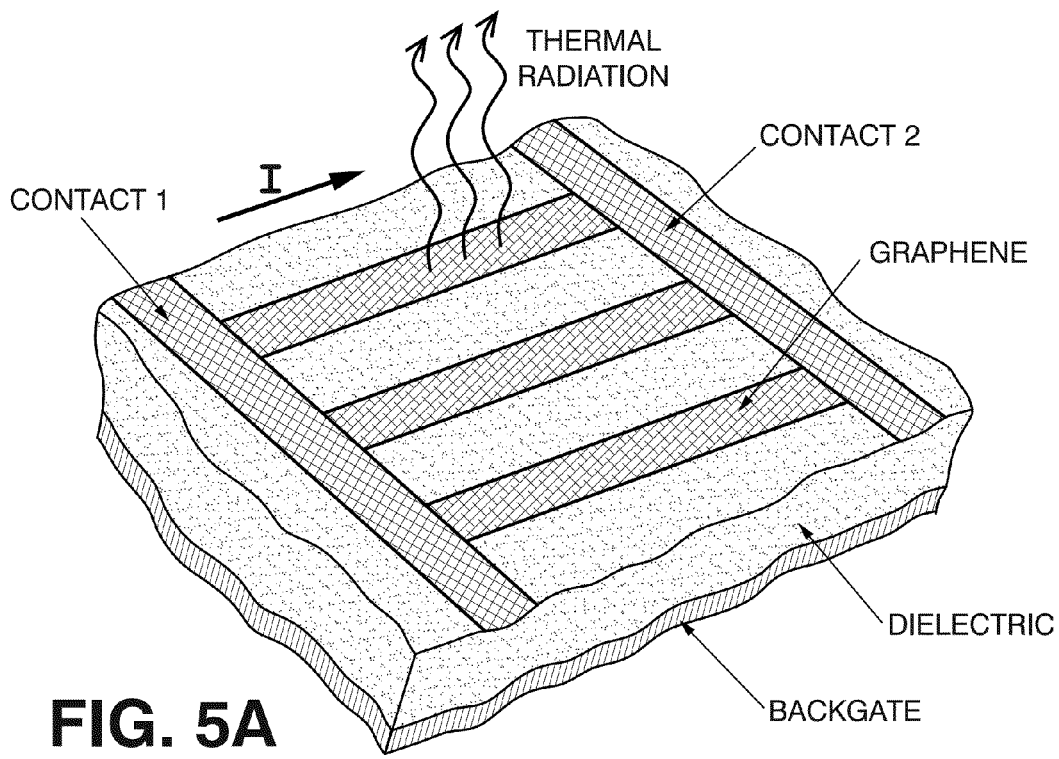
FIG. 5 shows a tunable light source device, comprising a patterned graphene layer and a heating element.
Figure 5B:
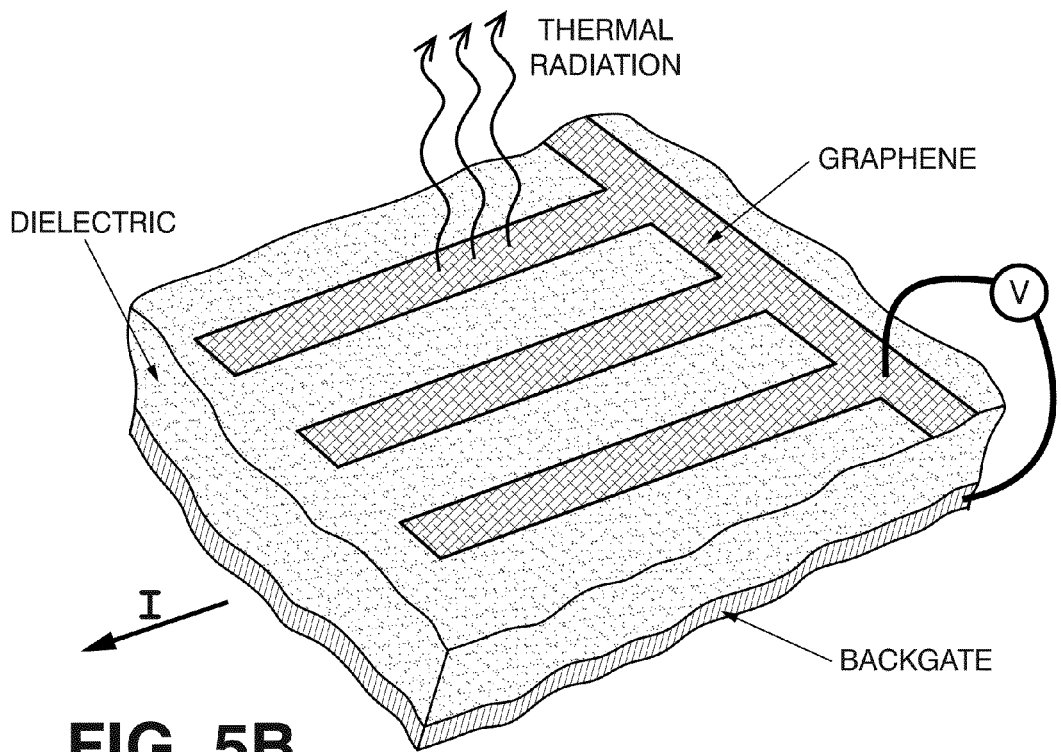

Two possible implementations of tunable sources are provided in FIG. 5. FIG. 5 shows an array of graphene ribbons, with plasmons tuned via backgate electrostatic doping, and two contacts (one of them can also be used for doping) create a current I through the graphene, which raises the temperature in the graphene by Joule electric losses, and thus produces thermal emission with a preferential tuned wavelength. In FIG. 5B, another alternative device is shown, in which heating occurs through a current running along the backgate.

Besides electrostatic doping, the charging of graphene can depend on the ambient conditions, particularly if the graphene is surrounded by a fluid. The pH condition of the fluid, or its chemical composition can affect the doping, and thus, the wavelength of the resulting plasmons supported by the graphene depends on the pH and the chemical composition of the fluid (e.g., on the concentration of different substances). In such a device, with the graphene surrounded by a fluid, the spectral photodetector is also a sensor: with fixed illumination with light of wavelength tuned to the plasmons of the graphene surrounded by a base fluid, any changes in the composition of the fluid that result in plasmon wavelength shifting will move the resonance away from the illuminating wavelength, thus producing a decrease in absorption. This can be detected through the thermocouple potential, thus revealing a change in the composition of the fluid.

A thermoelectric photodetector can be constructed in a similar way by placing a plasmonic structure (e.g., a nanoparticle, or any other patterned structure) close to a contact between two different conductors (e.g., two different metals, or even graphene and a metal), so that light absorption mediated by the plasmon of the plasmonic structure produces heating of the contact and therefore also a voltage induced by the Seebeck effect. This voltage is then read and it is roughly proportional to the amount of light being shone on the structure at the plasmon frequency. This type of device operates at a single wavelength. A spectral photodetector can then be constructed with an array of such detectors, each of them designed for a different wavelength, and with the set of detectors covering the desired spectral region (i.e., their resonant wavelengths must be separated by the width of the plasmon wavelengths, so that they cover the spectral region of interest exhaustively). This type of device can operate in the visible, near-infrared, infrared and THz.

Figure 6:
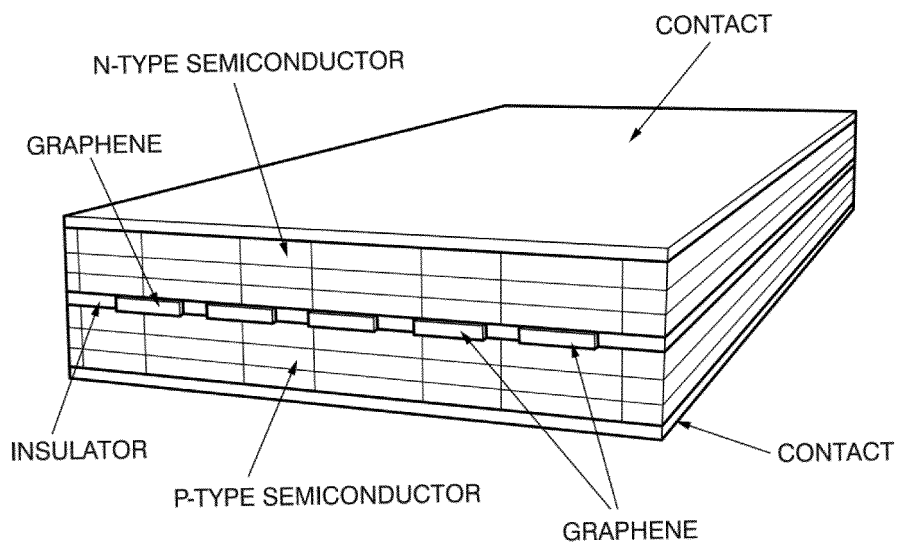
FIG. 6 shows a graphene-based photovoltaic element, in which light incident at a selected wavelength is converted into electricity.
Figure 7:
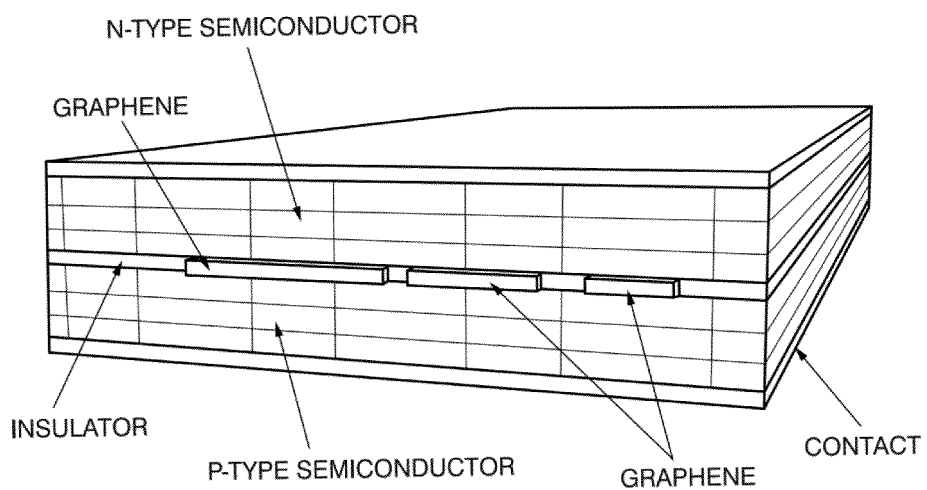
FIG. 7 shows a graphene-based photovoltaic device, with a wide range of wavelengths covering the desired part of the solar spectrum being absorbed at elements positioned in parallel.
Figure 8:
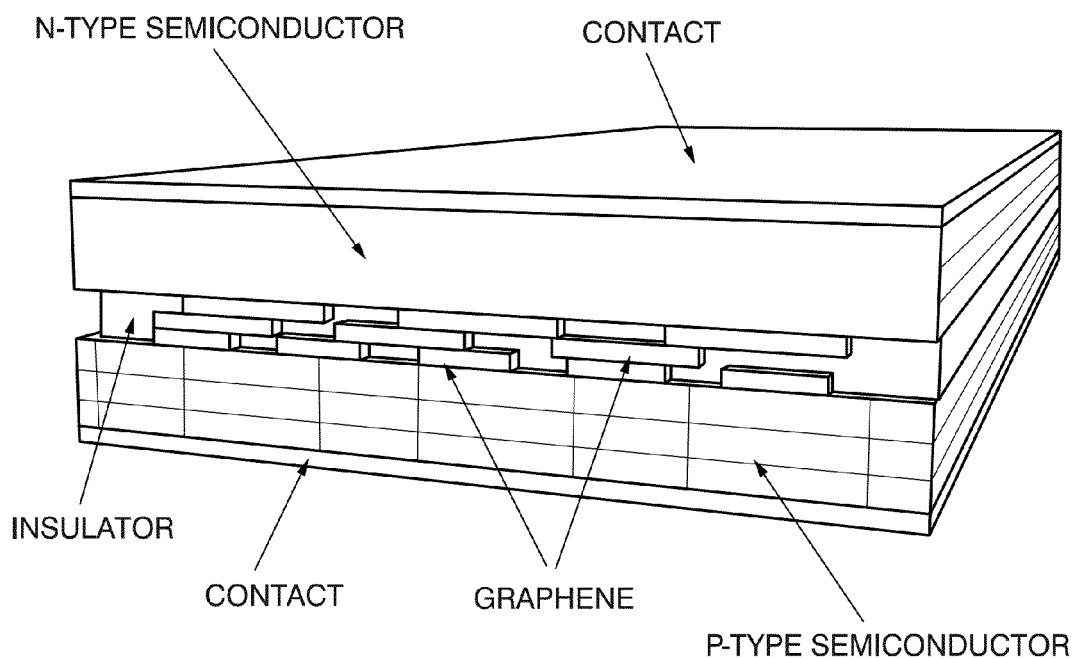
FIG. 8 shows a graphene-based photovoltaic device, with a wide range of wavelengths covering the desired part of the solar spectrum being absorbed at elements positioned vertically in a stack.

FIGS. 6, 7, and 8 show several arrangements of p-type and n-type semiconductors placed in contact with the patterned graphene, along with the necessary contacts to extract electrons and holes produced upon light absorption in the latter. In all embodiments, the graphene is in contact with p-type semiconductor, or n-type semiconductor, or both of them (one on each side of the graphene), so that electron-hole separation takes place by releasing these charge carriers through semiconductors of different doping, and from here to the metal contact to close the circuit an to be used as a source of electrical power.

FIG. 6 shows patterned graphene, sandwiched between p and n-type semiconducting materials. An insulating layer prevents direct contact between the p and n-type semiconducting materials.

FIG. 7 shows an alternative configuration to FIG. 6 where the graphene pattern varies laterally. Therefore, the wavelength sensitivity varies laterally.

FIG. 8 shows an alternative configuration to FIG. 6, consisting of a stack of patterned graphene sandwiched in between p and n-type semiconductors. The wavelength sensitivity varies vertically. In total this configuration is therefore intended to capture a larger wavelength range of incoming light.

Collection of IR radiation by the graphene structures of the invention can be done as follows: a graphene structure is patterned such that it absorbs light corresponding to a given plasmon frequency; the doping and decorating elements in the graphene are selected in order to promote electron-hole separation; such structure will then convert photons at the plasmon frequency into electrical signals; a stack of such structures is then made, each of them converting a certain part of the spectrum into electricity; alternatively, a parallel display with such structures of varying frequency are arranged so that they are exposed to light of the corresponding frequencies after the light has been spectrally separated by a prism or grating.

The invention finds application in a number of technologies such as security screening, microscope spectral imaging, IR vision, medical diagnosis, with optical IR probes, microscale product coding, optical signal processing and many more.

In this text, the term "comprises" and its derivations (such as "comprising", etc.) should not be understood in an excluding sense, that is, these terms should not be interpreted as excluding the possibility that what is described and defined may include further elements. On the other hand, the invention is obviously not limited to the specific embodiment(s) described herein, but also encompasses any variations that may be considered by any person skilled in the art (for example, as regards the choice of materials, dimensions, components, configuration, etc.), within the spirit of the invention.

The invention claimed is:

1. A spectral photoconversion device comprising a collector with at least an active layer of doped patterned monolayer, bilayer or carbon-multilayer graphene, wherein the graphene is patterned into a structured array.

2. A photoconversion device as in claim 1, wherein the graphene is patterned as nanodisks, nanoribbons, triangles, or hexagons, or other finite shapes.

3. A photoconversion device as in claim 1 further comprising means for doping the graphene in situ.

4. A photoconversion device as in claim 2 wherein the means is at least a backgate electrode and a contact for applying a voltage.

5. A photoconversion device as in claim 3 wherein the means is a substrate underlying the patterned graphene, capable of inducing charges at the interface with the graphene.

6. A photoconversion device as in claim 1 further comprising a dielectric-coated metal underlying the doped graphene.

7. A photoconversion device as in claim 1 comprising a plurality of graphene layers forming a stack or arranged in parallel.

8. A photoconversion device as in claim 1 comprising a substrate made of SiC.

9. A photoconversion device as in claim 1 further comprising a back electrode and electrostatic gates for tuning the wavelength sensitivity of the device.

10. A photoconversion device as in claim 9 further comprising insulators between the graphene and the gates and between the back electrode and the gates.

11. A photoconversion device as in claim 10 wherein the gates comprise Al, Ag, Au, Co, Ti, Ni, Cu and combinations thereof, ITO AZO or FTO, ultra thin metal films, nanotubes and graphene.

12. A photoconversion device as in claim 1 wherein the graphene layer changes its thickness along the device.

13. Use of a photoconversion device as in claim 1 as a sensor for fluids.

14. A light emitting device comprising a heat source and a photoconversion device as in claim 1.

15. A thermoelectric photodetector comprising a photoconversion device as in claim 1 and two metal contacts each at one side of the active region forming a thermocouple.

16. An IR source comprising the photoconversion device of claim 1 and a heat source.

17. An IR radiation collector comprising a photoconversion device as in claim 1 sandwiched between a p-type and an n-type semiconductor.

18. An IR radiation collector as in claim 16 wherein the active layer has a pattern that varies laterally.

19. An IR radiation collector as in claim 16 comprising a stack of active layers.

20. A photovoltaic cell comprising the photoconversion device of claim 1.

* * * * *